United States Patent [19]

Temple

[11] 4,207,583
[45] Jun. 10, 1980

[54] MULTIPLE GATED LIGHT FIRED THYRISTOR WITH NON-CRITICAL LIGHT PIPE COUPLING

[75] Inventor: Victor A. K. Temple, Clifton Park, N.Y.

[73] Assignee: Electric Power Research Institute, Palo Alto, Calif.

[21] Appl. No.: 928,464

[22] Filed: Jul. 27, 1978

[51] Int. Cl.² ............................................. H01L 29/74
[52] U.S. Cl. ......................................... 357/38; 357/30; 357/68; 357/86; 350/96.15
[58] Field of Search ...................... 357/30, 38, 68, 86; 350/96.15, 96.17

[56] References Cited

U.S. PATENT DOCUMENTS

| B 561,732 | 2/1976 | Roberts | 357/30 |
| 3,489,962 | 1/1970 | McIntyre et al. | 357/38 |
| 3,622,845 | 11/1971 | McIntyre et al. | 357/38 |
| 3,893,153 | 7/1975 | Page et al. | 357/38 |
| 3,938,173 | 2/1976 | Jackson et al. | 357/38 |
| 4,016,592 | 4/1977 | Yatsuo et al. | 357/38 |
| 4,047,219 | 9/1977 | Temple | 357/38 |
| 4,060,826 | 11/1977 | Voss | 357/38 |
| 4,128,759 | 12/1978 | Hunt et al. | 350/96.15 |

OTHER PUBLICATIONS

E. Schlegel et al., "A High Power Light Act. Thyrs.," Proc. IEEE, 1975, Int. Elec. Dev. Meet., pp. 483–486.
D. Silber et al., "Improved Gate Concept for Light Act. Pow. Thyrs.," 1975, Int. Elec. Dev. Meet. Conf. Rec., pp. 371–373.
J. Davis, "A Theoretical Model of Light-Fired Thyristors," IEEE Conf. Rec. of 1975, Pow. Engr. Spec. Conf., pp. 305–312.
V. Temple et al., "High Power Dual Amp. Gate Light Triggered Thyrs.," IEEE Trans. on Elec. Dev., vol., Ed.-23 #8, Aug. 1976, pp. 893–898.
D. Silber et al., "Progress in Light Act. Power Thyristors," IEEE Trans. on Elec. Dev., vol. Ed.-23 #8, Aug. 1976, pp. 899–904.
P. Debruyne et al., "Light Sensitive Struct. for High Volt. Thyristors," 1976, IEEE Conf. Rec. of Pow. Electr. Spec. Conf., pp. 262–266.

Primary Examiner—Joseph E. Clawson, Jr.
Attorney, Agent, or Firm—Flehr, Hohbach, Test, Albritton & Herbert

[57] ABSTRACT

A radiation responsive thyristor device is provided with a relatively large radiation receiving region in which numerous interconnected emitter shorts are provided. A metalization pattern overlies the radiation receiving region. Openings in the metalization pattern admit incident radiation to the underlying semiconductor surface. The metalization pattern connects with an adjacent contact which may be either a main emitter electrode or an amplifying stage gate electrode. Light fibers carrying radiation of sufficient intensity to fire the thyristor are coupled at non-specific locations adjacent the radiation receiving region. At least some of the light fibers will supply incident radiation to the thyristor through the openings in the metalization pattern, producing substantially simultaneous thyristor turn-on at a plurality of separate locations.

16 Claims, 7 Drawing Figures

MULTIPLE GATED LIGHT FIRED THYRISTOR WITH NON-CRITICAL LIGHT PIPE COUPLING

BACKGROUND OF THE INVENTION

The invention relates to thyristors of the type employing gate current generated by incident radiation penetrating the semiconductor material, such thyristors being generally known as light-fired or radiation responsive thyristors.

Light-fired thyristors are particularly useful in controlling high voltage circuits where a high degree of electrical isolation is important. In one typical type of installation, a light-fired thyristor is installed in a high voltage circuit and is triggered from a relatively distant location through conventional light fibers. The light fibers used are generally small, having diameters on the order of two or three thousandths of an inch, and are conventionally bundled together to form a larger light conduit. For thyristor triggering, one end of the light conduit is generally coupled directly to a light-fired thyristor.

Because the gate current available in light-fired thyristors is low, such thyristors must have relatively high gate sensitivity. As a result, light-fired thyristors tend to have short turn-on lines which significantly reduce the current handling capacity of the device during initial turn-on. Consequently, light-fired thyristors generally have relatively low di/dt ratings.

One technique for increasing the di/dt rating of a thyristor is described in U.S. patent application Ser. No. 907,931, filed May 22, 1978, assigned to the assignee of the present application. The thyristor described in application Ser. No. 907,931 provides for a plurality of separated light-responsive regions which produce multiple gating of the thyristor. If each of the separated light-responsive regions is illuminated simultaneously, the total turned-on area of the device is substantially increased. The di/dt rating of the device is thereby improved.

A significant problem encountered with coincident gating of a multigate light-fired thyristor is the coupling of the light fibers to specific points within the radiation receiving region of the device. Given the small size of the light fibers and of the thyristor itself, it is difficult and expensive to obtain accurate positioning of the fibers.

OBJECTS AND SUMMARY OF THE INVENTION

It is the general object of the present invention to provide a multiple gated radiation responsive thyristor in which the accurate positioning of light fibers with respect to the thyristor is unnecessary.

Another object of the invention is to provide a radiation responsive thyristor in which multiple coincident gating is achieved at significantly reduced cost.

Accordingly, a thyristor is provided comprising a semiconductor body having a top surface and having at least four zones of alternate conductivity type. The body includes an emitter zone extending to the top surface, and a base zone adjacent the emitter zone. A radiation receiving region is located on the top surface. Contact means on the top surface contact the emitter zone and extend over portions of the radiation receiving region. The contact means includes a plurality of openings for admitting radiation to the radiation receiving region. The contact means contacts the base zone at discrete locations within the radiation receiving regions to form a plurality of emitter shorts. Thus, radiation penetrating the body at a plurality of random locations within the radiation receiving region produces substantially simultaneous thyristor turn-on at a plurality of separate locations.

DESCRIPTION OF THE PREFERRED EMBODIMENT

Figure 1:
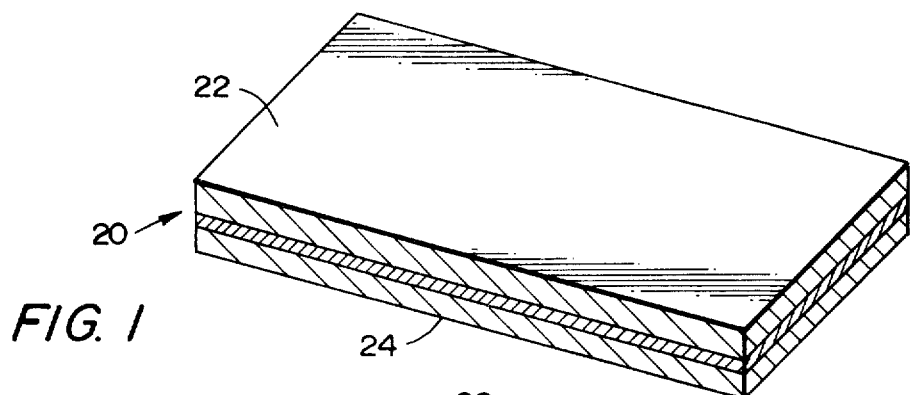
FIGS. 1–4 are perspective views in partial cross-section showing steps in the method of forming a thyristor device according to the present invention.
Figure 2:
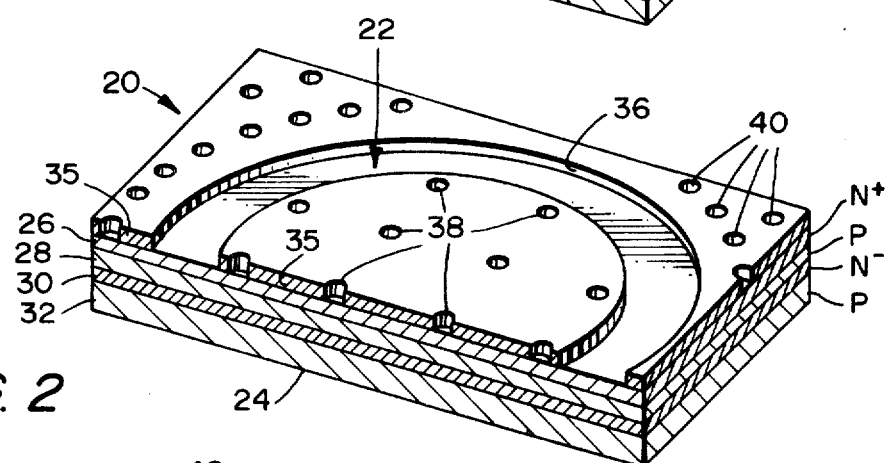

Formation of a thyristor according to the present invention begins with a semiconductor body 20, shown in FIG. 1. Body 20 is typically formed of monocrystalline silicon processed to provide a PNP structure. The opposed top and bottom surfaces of body 20 are designated 22 and 24, respectively. A suitable method of forming body 20 begins with an N-type semiconductor chip into which impurities are introduced through the top and bottom surfaces. One or more of the conductivity zones may alternatively be formed by epitaxial growth or ion implantation. To obtain the typical thyristor configuration having at least four zones of alternate conductivity type, an additional zone of N conductivity type is added to the PNP body of FIG. 1. To add a fourth zone of N conductivity type to body 20, conventional diffusion, epitaxial growth or ion implantation techniques can be used. The resultant semiconductor body 20 is shown in FIG. 2. Four zones of alternate conductivity type are present, designated 26, 28, 30 and 32. Zone 26, which forms the thyristor emitter zone, extends to top surface 22 and is of N conductivity type. Adjacent the emitter zone is base zone 28, which is of P conductivity type. Adjacent the base zone is a third zone 30, which is of N conductivity type. Bottom zone 32 is of P conductivity type. Zones 26 and 30 are designated N+ and N− in FIG. 2 to indicate the relatively higher levels of N type impurity doping in emitter zone 26.

To form a thyristor according to the present invention from the four-layer body 20 shown in FIG. 2, conventional photolithographic and etching techniques are employed. Top surface 22 is initially coated with a first masking layer 35, preferably comprising a conventional photoresist. Mask 35 initially covers the entire top surface 22, and portions are then removed by conventional photolithographic techniques to produce a masking pattern, shown in part in FIG. 2. The mask includes a broad annular opening 36. A plurality of small holes 38 are formed inside annular opening 36, and a different pattern of similar but more numerous holes 40 are formed outside annular opening 36. Holes 38 and 40 will provide emitter shorts for the thyristor.

Figure 3:
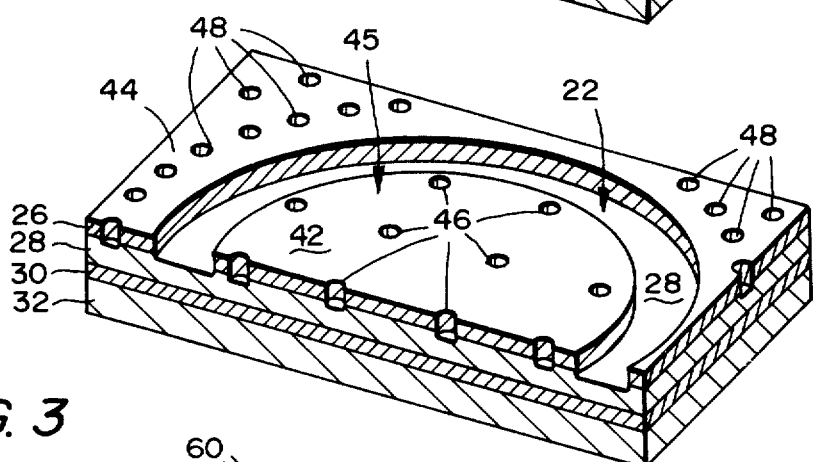

Following formation of the masking pattern shown in FIG. 2, conventional etching techniques are employed to etch into the upper surface 22 of body 20. An etching solution is used which attacks the silicon of body 20 but not masking layer 35. Etching is allowed to proceed to a depth sufficient to penetrate through emitter zone 26 and expose base zone 28, separating the emitter zone into two separate regions. The resultant configuration, with mask 35 removed, is shown in FIG. 3. Emitter zone 26 has been divided; the central portion serving as a radiation responsive emitter 42, and the remainder forming a main emitter 44. Radiation responsive emitter 42 is substantially coextensive with the radiation receiving region 45 of the device. Etching also proceeded through mask holes 38 and 40 to produce holes 46 and 48, respectively, through the emitter zone.

Other conventional techniques could alternatively be employed to produce a pattern of N+ regions on top surface 22 equivalent to that shown in FIG. 3. The most suitable alternative approach would be to employ the well known technique of masked diffusion. A masking layer of silicon dioxide or the like would be initially grown or otherwise laid down on the top P-type zone of the three-layer body in FIG. 1. Portions of the mask would then be removed by conventional photolithographic and etching techniques to expose those areas of the surface wher N+ regions are to be formed. N-type impurities would than be diffused into the exposed area, producing the desired pattern of emitter regions on top surface 22.

Figure 4:
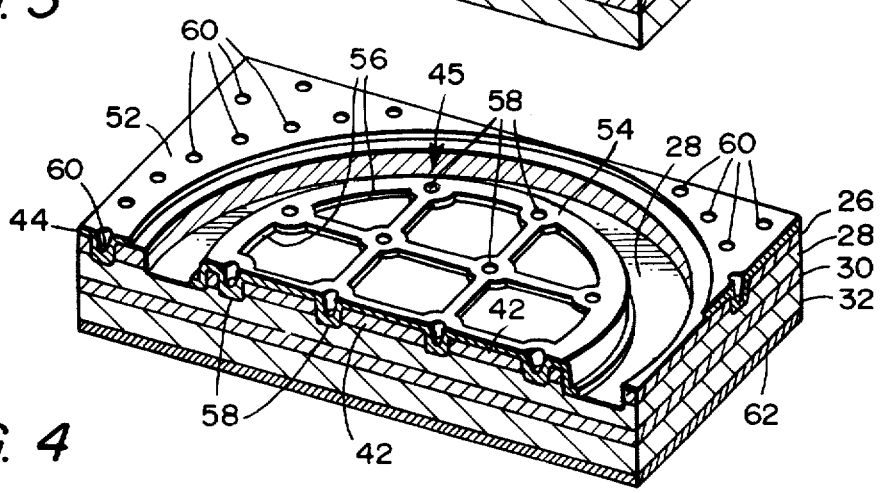

Following formation of the N+ pattern of FIG. 3, top surface 22 is coated by conventional means with a layer of suitable conductive metal, such as aluminum. A pattern of metalization is then formed by etching away the undesired metal. Referring to FIG. 4, metalization layer 50 is separated into a cathode electrode 52 and amplifying stage electrode 54. A plurality of openings 56 are formed in amplifying stage electrode 54 during the metal etching step. Amplifying stage electrode 54 forms the thyristor contact means which contacts emitter 42, and also base zone 28 at discrete locations through holes 46 within radiation receiving region 45. The metal deposited in holes 46 and 48 establishes a plurality of emitter shorts, 58 and 60, respectively. The completed thyristor also includes a metalized electrode 62 on bottom surface 24 in contact with P-type zone 32, forming the thyristor anode.

Figure 5:
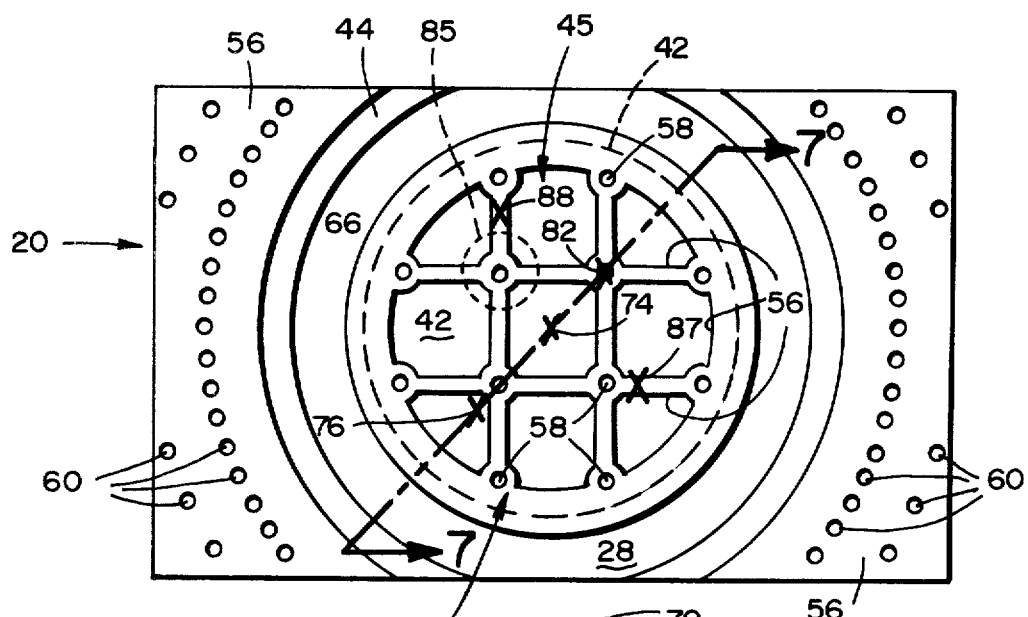
FIG. 5 is a partial top view of the thyristor device shown in FIG. 4.

The respective elements on top surface 22 are illustrated in FIG. 5. The preferred device incorporates radiation receiving region 45 into an amplifying stage. Radiation responsive emitter 42 is centrally disposed on the top surface, surrounded by exposed areas of base zone 28. Contact means on top surface 22 for carrying gate current from the radiation receiving region to the main current carrying part of the device is formed by amplifying stage electrode 54. Electrode 54 comprises a metalization pattern on top surface 22 in contact with emitter 42 and extending over portions of the radiation receiving region. The metalization pattern is in the form of a conductive grid with an outer ring of metalization 66 overlying the edge of emitter 42. Ring 66 extends outside radiation responsive emitter 42 to contact the exposed portion of base zone 28 extending to top surface 22. Emitter shorts 58 are located at the intersections of the metal strips forming grid 64 and are interconnected thereby. A plurality of openings 56 in grid 64 admit radiation to the radiation receiving region of the thyristor. Cathode electrode 52 overlies the main current carrying part of the device, and includes numerous emitter shorts 60 arranged in any conventional manner.

Figure 6:
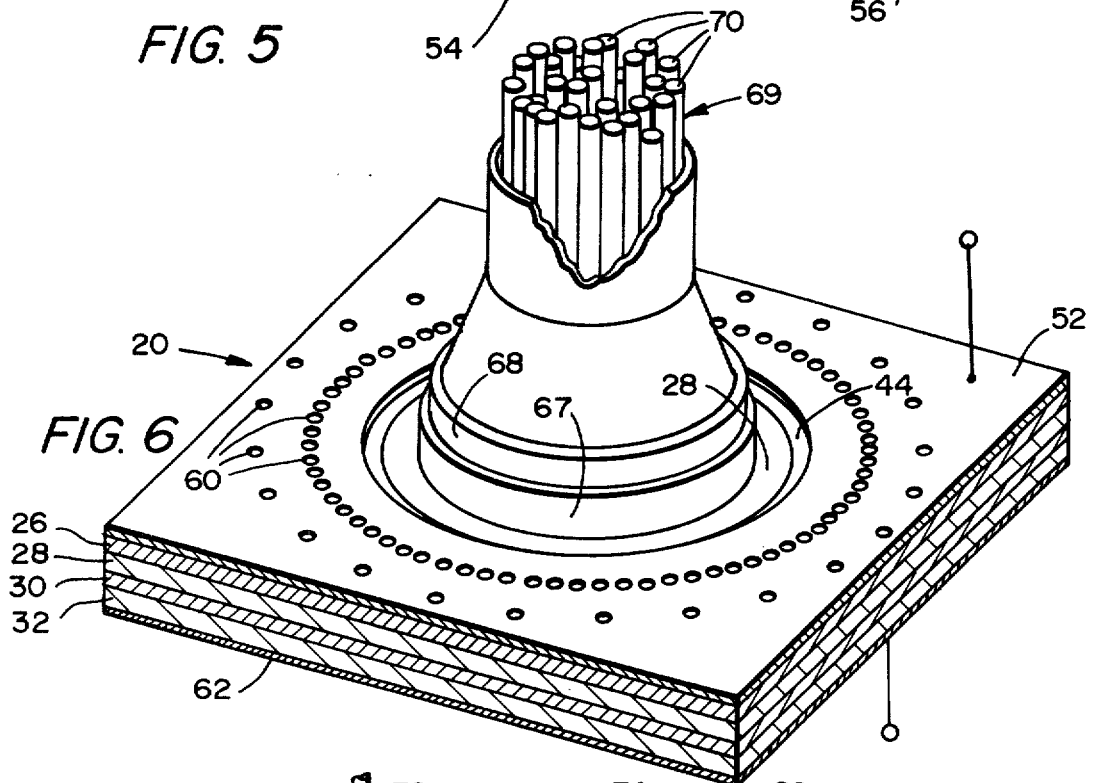
FIG. 6 is a perspective view in partial cross-section showing the thyristor of FIG. 5 together with coupling means for light fibers and a light conduit connection.

Referring to FIG. 6, a plurality of light fibers are preferably employed to provide radiation to trigger the thyristor. In the preferred embodiment, the semiconductor chip which includes body 20 is incorporated into a package which includes some form of light fiber coupling means. A suitable light fiber coupler for this purpose takes the form of a plastic collar 67 mounted directly over radiation receiving region 45. Although not shown in FIG. 6, the coupling collar 67 would be supported by the thyristor package, which may assume any conventional form. Coupler 67 is adapted to receive and engage a cooperating coupler 68 attached to the ends of a light conduit 69 formed of numerous light fibers 70. If the thyristor package is hermetically sealed, a suitable transparent window would be incorporated into coupler 67 to permit radiation to reach the thyristor. Alternatively, a hermetically sealed package could be provided with a transparent window in the package wall, and a short internal light fiber conduit extending from the window to the radiation receiving region of the thyristor. An external light conduit could then be coupled adjacent the package window. It should therefore be understood that the light fiber coupler illustrated in FIG. 6 is suggestive only, and that alternative coupler configurations are possible.

With the end of the light conduit coupled into collar 67, the numerous light fibers 70 are positioned directly over radiation receiving region 43. At least some of the light fibers will terminate adjacent openings 56 in grid 64 so that the radiation supplied by the light fibers will penetrate the radiation receiving region. Preferably, the light fibers are small relative to openings 56 in grid 64 so that numerous fibers will be positioned over each opening. If the area irradiated by each fiber is small relative to openings 56, the total number of areas turned-on (by the turn-on process described below) will be increased. The light conduit coupler need not specifically orient the light fibers with respect to the radiation receiving region. Individual fibers will terminate at non-specific locations. It is a particular feature of the present invention that multiple thyristor gating is achieved without precise alignment of individual light fibers to specific points on the thyristor surface.

In operation, the thyristor is first installed in a circuit where switching is desired, with cathode 52 and anode 62 connected to appropriate circuit terminals and a light conduit 69 installed in coupler 67. With the anode 62 forward biased relative to cathode 52, only a small forward leakage current passes through the device prior to firing. To trigger the device, a source of radiation is illuminated at the far end of light fibers 70. Preferably a relatively high intensity light source is employed, for reasons described below. Laser light is particularly advantageous for this purpose. Upon illumination of the light source, light fibers 70 immediately transmit the radiation to radiation receiving region 45 of the thyristor. Radiation emanating from fibers positioned over openings 56 in grid 64 will penetrate semiconductor body 20 causing hole-electron pairs to be generated by well known photogenerative processes.

Figure 7:
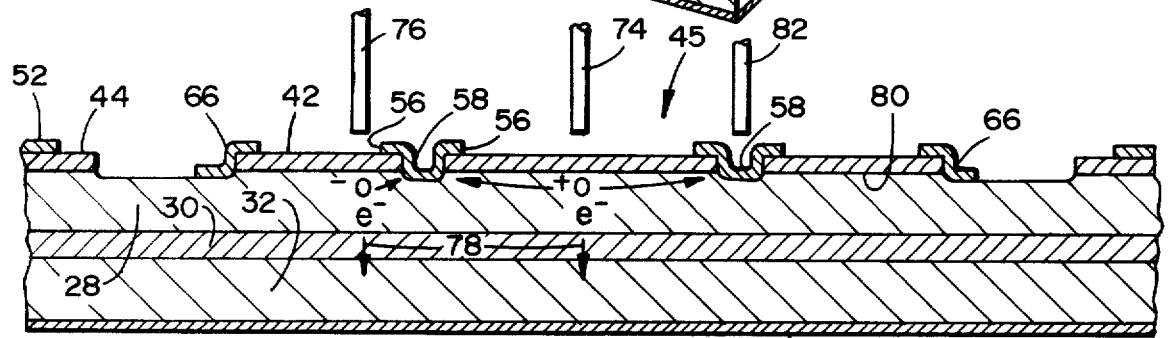
FIG. 7 is a cross-sectional view taken along line 7—7 of FIG. 5.

FIG. 7 illustrates the process of multiple simultaneous gating during turn-on. Light fibers positioned at selected random locations (marked by Xs in FIG. 5) will be used to illustrate the process. Fibers 74 and 76 are both assumed to be positioned over openings 56 in the conductive grid 64. Thus, radiation emerging from the ends of fibers 74 and 76 will penetrate the semiconductor body. Because in the preferred embodiment the radiation receiving region is in a four-layer portion of the device, the radiation passes first through emitter 42 and then into base zone 28, and possibly further. The radiation generates holes-electron pairs in the semiconductor material. With the device forward biased, the electrons will be drawn toward anode 62 in the direction of arrows 78. The positive hole current forward biases the pn junction 80 between emitter 42 and base 28. The greatest bias is developed beneath fiber 74 because the distance to the nearest emitter short is the greatest. The hole current must therefore pass through more of base zone 28, increasing the forward bias along juntion 80. As is well known in the art, when sufficient forward bias is developed, electrons are injected into the base from the emitter, turning on the device. Beneath fiber 74, the turned-on area will tend to spread radially outwardly along junction 80 toward the surrounding emitter shorts.

In the region beneath fiber 76, turn-on occurs in almost the same manner as beneath fiber 74. Electrons produced by photogeneration will be drawn toward the anode and holes will move toward the nearest emitter short. Fiber 76 is much closer to a short than fiber 74. The voltage developed along junction 80 will therefore be lower for a given radiation intensity than beneath fiber 74. For this reason, the intensity of the radiation source is preferably as high as possible, so that those fibers located near emitter shorts will still produce turn-on.

Thyristors of the present invention have a nonuniform gate sensitivity over the radiation receiving region. Maximum sensitivity is at positions such as 74, centrally disposed relative to the surrounding emitter shorts. Closer to shorts 58, the sensitivity is reduced. An approximation of the line at which the peak gate sensitivity (of location 74) is reduced by half is given by line 85 in FIG. 5. Fibers positioned too close too a short will not cause turn-on. Also, all fibers positioned over metalized areas, such as at 82, 87 and 88, will not cause turn-on. Nevertheless, assuming a sufficient number of fibers are used, at least some will terminate adjacent grid openings 56 to produce multiple gating of the thyristor. If the radiation supplied through each light fiber is approximately several times the threshold level required to produce turn-on at position 74, multiple turn-on will be substantially simultaneous even between areas of differing sensitivities. use of such a high level of radiation will also reduce turn-on delay time.

To complete the thyristor turn-on process, the turned-on area of junction 80 will spread from beneath the fibers 74 and 76, and other fibers within openings 56. Turn-on causes electrons to flow in large numbers out of emitter 42, causing the amplifying stage electrode 54 to become positive. The metal strips comprising grid portion 64 of electrode 54 provide means for the current to flow out to ring portion 62, which contacts base 28. When electrode 54 becomes sufficiently positive, the main current-carrying portion of the thyristor beneath cathode 52 is turned on by convention amplifying-gate action. Once turned on, the thyristor permits a substantially free flow of current between anode 32 and cathode 52.

The position and spacing of emitter shorts 58 in the radiation receiving region of the thyristor determines the overall average sensitivity of the device. The emitter shorts are preferably spaced apart a predetermined minimum distance to provide equal spacing and thus a predetermined average gate sensitivity over the radiation receiving region. If the spacing between the emitter shorts is irregular, the likelihood of simultaneous turn-on is reduced. The particular spacing used is not critical, however, and can be tailored to design requirements, particularly that of dV/dt capability.

For example, in a device having a P-base resistance of 3800 ohms per square, and a pattern of emitter shorts as shown in FIG. 5, with four mil diameter shorts at 32 mils separation, the maximum gate sensitivity is approximately 0.44 milliamps. That figure represents the sensitivity at the center of the radiation receiving region (the location of fiber 74) using light fibers with a diameter of 3 mils. As noted above, gate sensitivity decreases at locations closer to the emitter shorts. It is estimated that the radiation receiving areas closer than approximately line 85 will have less than one-half the maximum gate sensitivity. For effective multiple coincident gating in the above example, it is recommended that a light source having an intensity sufficient to produce at least 0.9 milliamps trigger current be employed. In that way all fibers which fall within openings 56 and no closer to the emitter shorts than line 85 will produce turn-on. Preferably, an even larger amplitude radiation source will be used so as to produce more uniform simultaneous turn-on between fiber location of differing sensitivity.

As an example of tailoring the device to design requirements, the above example having 32 mil spacing between the emitter shorts has a dV/dt rating of 1300 volts per microsecond. To increase the dV/dt rating, the intershort spacing can be reduced. For example, if a 25 mil intershort spacing is used, the dV/dt rating of the device would be approximately 2000 volts per microsecond. The 25 mil intershort spacing would lower the overall average gate sensitivity of the device, however.

The present invention eliminates the need for precisely positioning the optical fibers with respect to the radiation receiving region of the device. There is no need to fix individual optical fibers with respect to points on the thyristor, such as is suggested in application Ser. No. 907,931, filed May 22, 1978 and assigned to the assignee of the present application. Instead, only a relatively large, noncritical coupling device is used which ties numerous optical fibers to the device. A significant savings in fabrication cost is thereby realized. The resultant thyristor is also more practical to use, due to the convenience offered by the simple fiber coupling. The invention nevertheless achieves multiple gated operation which produces the associated advantages of a greater turn-on area and improved di/dt rating.

The pattern of metalization and emitter shorts shown in the preferred embodiment is suggestive only. The emitter shorts can be arranged in any suitable pattern, although, as noted above, it is desirable that the minimum intershort spacing be approximately equal. As will be apparent, it is especially desirable to have relatively large openings in the metalized pattern for admitting radiation to the radiation receiving region.

It is not necessary to incorporate an amplifying stage into the device. In a single-emitter device, the contact means overlying the radiation receiving region of the device would form a portion of the thyristor cathode electrode. If no amplifying stage is used, the emitter zone of the device would preferably extend over the entire top surface and the radiation receiving region would encompass a portion of the emitter. Another alternative would be to use a three-layer radiation receiving region, where the base zone is directly illuminated by incident radiation. Such a construction could be readily achieved by etching away the exposed emitter zone within openings 56. Multiple coincident gating would still occur in such a device.

The invention provides a multiple gated radiation responsive thyristor device in which the accurate positioning of light fibers with respect to the thyristor is unnecessary. The invention achieves a radiation responsive thyristor with multiple coincident gating at significantly reduced cost.

What is claimed is:

1. A thyristor comprising: a semiconductor body having a top surface and having at least four zones of alternate conductivity type, including an emitter zone extending to said top surface, and a base zone adjacent said emitter zone, a radiation receiving region on said top surface, contact means on said top surface in contact with said emitter zone and extending over portions of said radiation receiving region, said contact means including a plurality of openings for admitting radiation to said radiation receiving region, said contact means contacting said base zone at discrete locations within said radiation receiving region to form a plurality of emitter shorts whereby radiation penetrating said body at a plurality of random locations within said radiation receiving region produces substantially simultaneous thyristor turn-on at a plurality of separate locations.

2. A thyristor as in claim 1 in which said emitter shorts are spaced apart a predetermined minimum distance within said radiation receiving region.

3. A thyristor as in claim 2 in which said contact means includes a metalization pattern on said top surface overlying said radiation receiving region, said emitter shorts being electrically interconnected by said metalization pattern.

4. A thyristor as in claim 1 in which said radiation receiving region encompasses a portion of said emitter zone in a part of said semiconductor body having said at least four zones of alternate conductivity type.

5. A thyristor as in claim 4 in which said contact means includes a conductive grid overlying said radiation receiving region in contact with said emitter zone.

6. A thyristor as in claim 5 in which said conductive grid includes intersecting strips of metalization on said top surface, said emitter shorts being located at the intersections of said strips of metalization.

7. A thyristor as in claim 1 in which said emitter zone includes a radiation responsive emitter separated from the remainder of said emitter zone, said radiation responsive emitter being substantially coextensive with said radiation receiving region, said contact means overlying said radiation responsive emitter and also contacting adjacent portions of said base zone to form an amplifying stage electrode.

8. A thyristor as in claim 7 in which said radiation responsive emitter is centrally disposed on said top surface, being surrounded by exposed areas of said base zone which extend to said top surface, said contact means including a ring of metalization overlying the edge of said radiation responsive emitter and adjacent portions of said base zone, and including a conductive grid inside said ring of metalization, said emitter shorts being positioned on said conductive grid spaced a predetermined minimum distance apart.

9. A thyristor as in claim 1 together with a plurality of light fibers terminating at non-specific locations adjacent said radiation receiving region, at least some of said light fibers terminating adjacent said openings in said contact means whereby radiation supplied by said light fibers will penetrate said semiconductor body and cause thyristor turn-on.

10. A thyristor together with light fibers as in claim 9 in which the areas of said radiation receiving region irradiated by said light fibers are substantially smaller than said openings in said contact means.

11. A radiation responsive thyristor device comprising: a semiconductor body having a top surface and having at least four zones of alternate conductivity type, including an emitter zone extending to said top surface, and a base zone adjacent said emitter zone, a radiation receiving region on said top surface encompassing a portion of said emitter zone, contact means on said top surface in contact with said emitter zone, said contact means including a conductive grid overlying said radiation receiving region having a plurality of openings therein for admitting radiation to said radiation receiving region, said conductive grid contacting said base zone at discrete locations within said radiation receiving region to form a plurality of emitter shorts, said emitter shorts being spaced a predetermined minimum distance apart, and light fiber coupling means for receiving and holding a plurality of light fibers at non-specific locations adjacent said radiation receiving region such that at least some of said light fibers terminate adjacent said openings in said conductive grid whereby radiation supplied by said light fibers will penetrate said body to produce substantially simultaneous thyristor turn-on at a plurality of separate locations.

12. A thyristor device as in claim 11 in which said conductive grid includes intersecting strips of metalization on said top surface overlying said radiation receiving region.

13. A thyristor device as in claim 12 in which said emitter shorts are located at the intersections of said strips of metalization.

14. A thyristor device as in claim 11 in which said emitter zone includes a radiation responsive emitter separated from the remainder of said emitter zone and substantially coextensive with said radiation receiving region, said contact means including an area of metalization overlying the edge of said radiation responsive emitter and including said conductive grid overlying the remainder of said radiation responsive emitter, said contact means also contacting adjacent portions of said base zone to form an amplifying stage electrode.

15. A thyristor device as in claim 14 in which said radiation responsive emitter is centrally disposed on said top surface, being surrounded by exposed areas of said base zone which extend to said top surface, said area of metalization overlying the edge of said radiation responsive emitter extending outside said radiation responsive emitter to contact said base zone.

16. A thyristor device as in claim 15 further including an emitter electrode on said top surface in contact with the portions of said emitter zone outside said exposed areas of said base zone.

* * * * *